United States Patent
Kawashima et al.

(10) Patent No.: US 6,708,390 B2
(45) Date of Patent: Mar. 23, 2004

(54) METHOD FOR MANUFACTURING MAGNETORESISTIVE ELEMENT

(75) Inventors: Yoshio Kawashima, Neyagawa (JP); Akihiro Odagawa, Tsuchiura (JP); Nozomu Matsukawa, Nara (JP); Yasunari Sugita, Osaka (JP); Yasunori Morinaga, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/421,989

(22) Filed: Apr. 23, 2003

(65) Prior Publication Data

US 2003/0196316 A1 Oct. 23, 2003

(30) Foreign Application Priority Data

Apr. 23, 2002 (JP) ........................................ 2002-120431

(51) Int. Cl.$^7$ ............................................. G11B 5/127
(52) U.S. Cl. ................. 29/603.07; 29/603.13; 29/603.14
(58) Field of Search .................... 29/603.14, 603.13, 29/603.07; 360/113, 121, 135; 428/682, 336, 693, 697, 699, 701

(56) References Cited

U.S. PATENT DOCUMENTS

| | | | |
|---|---|---|---|
| 5,262,914 A | | 11/1993 | Chen et al. |
| 5,729,409 A | * | 3/1998 | Ohashi et al. ............... 360/327 |
| 5,923,504 A | * | 7/1999 | Araki et al. ........... 360/324.11 |
| 6,004,654 A | * | 12/1999 | Shinjo et al. ................ 428/161 |
| 6,027,824 A | * | 2/2000 | Suwabe et al. ............. 428/682 |
| 2002/0044396 A1 | | 4/2002 | Amano et al. |

* cited by examiner

*Primary Examiner*—Carl J. Arbes
*Assistant Examiner*—Tai Van Nguyen
(74) *Attorney, Agent, or Firm*—Merchant & Gould P.C.

(57) ABSTRACT

The present invention provides a magnetoresistive element that can suppress the characteristic degradation even after high-temperature heat treatment, specifically at 400° C. to 450° C. This element is manufactured by a method that includes the following processes in the indicated order: a film formation process for forming at least a first ferromagnetic layer, a second ferromagnetic layer, and a non-magnetic layer on a substrate; a preheat process at 330° C. to 380° C. for not less than 60 minutes; and a heat treatment process at 400° C. to 450° C. This element has a resistance value that changes with a change in relative angle formed by the magnetization directions of the first ferromagnetic layer and the second ferromagnetic layer.

10 Claims, 3 Drawing Sheets

METHOD FOR MANUFACTURING MAGNETORESISTIVE ELEMENT

BACKGROUND OF THE INVENTION

1. Field of the Invention

The present invention relates to a method for manufacturing a magnetoresistive element that is used in a magnetic sensor, a magnetic head, a magnetoresistive memory (a magnetic random access memory, referred to as "MRAM"), etc.

2. Description of the Related Art

A magnetoresistance effect is a phenomenon in which electrical resistance changes by the application of a magnetic field to a magnetic material. A multilayer film having a structure in which a magnetic layer and a non-magnetic layer are stacked alternately (i.e., magnetic layer/non-magnetic layer/magnetic layer/non-magnetic layer/ . . . ) can provide a large magnetoresistance effect known as a giant magnetoresistance (GMR) effect. For a GMR element, a conductive layer made of Cu, Au, etc. is used as the non-magnetic layer. A GMR element that allows a current to flow parallel to the film surface is called a CIP-GMR (current in plane-GMR) element. A GMR element that allows a current to flow perpendicular to the film surface is called a CPP-GMR (current perpendicular to the plane-GMR) element. The CPP-GMR element has a larger magnetoresistance change ratio (MR ratio) and a smaller resistance value compared with the CIP-GMR element.

A spin valve element is one of the magnetoresistive elements that does not require a large operating magnetic field. This element includes a free magnetic layer and a pinned magnetic layer that sandwich a non-magnetic layer. The spin valve element utilizes a change in relative angle formed by the magnetization directions of the two magnetic layers that is caused by magnetization rotation of the free magnetic layer. As an example of the spin valve GMR element, an element in which a magnetization rotation control layer made of an antiferromagnetic material (FeMn) is stacked on a Ni—Fe/Cu/Ni—Fe multilayer film has been proposed. Although this element requires a smaller operating magnetic field and has excellent linearity, the MR ratio is low. Another spin valve GMR element has been reported that improves the MR ratio by using a CoFe ferromagnetic material for the magnetic layer and PtMn and IrMn ferromagnetic materials for the antiferromagnetic layer.

To achieve a higher MR ratio, an element that uses an insulating material for the non-magnetic layer and allows a current to flow perpendicular to the film surface has been proposed as well. This element can provide a so-called tunnel magnetoresistance (TMR) effect by statistically transmitting a tunnel current through the non-magnetic layer (tunnel layer) that serves as an insulating layer. A higher MR ratio can be expected from the TMR element as the spin polarization of the magnetic layers sandwiching the insulating layer is increased. Therefore, magnetic metals such as Fe, Fe—Co alloy and Ni—Fe alloy, a half-metallic ferromagnetic material, or the like are suitable for the magnetic layers.

There also have been studies on an MRAM device that is produced by forming a magnetoresistive element on CMOS. Such a CMOS process includes high-temperature heat treatment at 400° C. to 450° C. However, the heat treatment at not less than 400° C. reduces the MR ratio of the magnetoresistive element.

SUMMARY OF THE INVENTION

It is an object of the present invention to provide a magnetoresistive element that can suppress the characteristic degradation even after high-temperature heat treatment, specifically at 400° C. to 450° C.

The present invention provides a method for manufacturing a magnetoresistive element. The magnetoresistive element includes a substrate and a multilayer film formed on the substrate. The multilayer film includes a first ferromagnetic layer, a second ferromagnetic layer, and a non-magnetic layer arranged between the first ferromagnetic layer and the second ferromagnetic layer. A resistance value changes with a change in relative angle formed by the magnetization directions of the first ferromagnetic layer and the second ferromagnetic layer. The manufacturing method of the present invention includes the following: a film formation process for forming at least the first ferromagnetic layer, the second ferromagnetic layer, and the non-magnetic layer on the substrate; a preheat process at 330° C. to 380° C. for not less than 60 minutes, e.g., for 60 to 300 minutes, and preferably for 60 to 180 minutes performed after the film formation process; and a heat treatment process at 400° C. to 450° C. performed after the preheat process.

DESCRIPTION OF THE PREFERRED EMBODIMENTS

Figure 1:
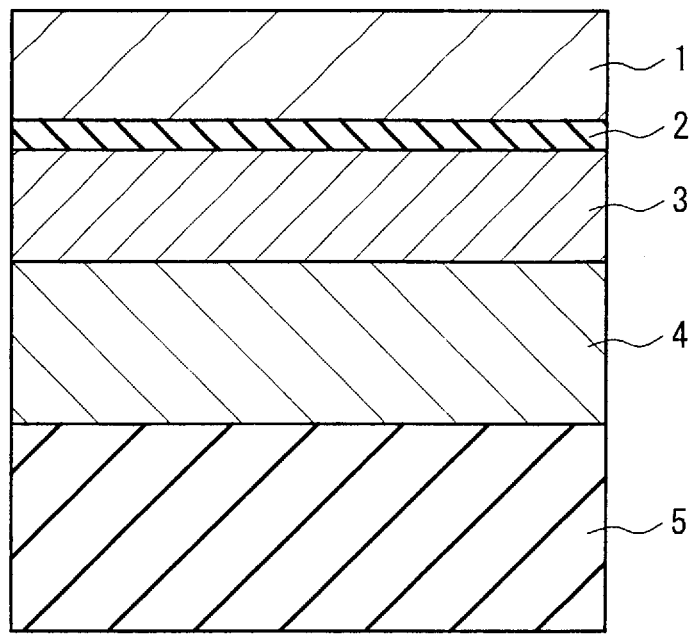
FIG. 1 is a cross-sectional view showing an example of a magnetoresistive element manufactured by a method of the present invention.

According to the present invention, the preheat process can suppress the characteristic degradation of a magnetoresistive element in the subsequent heat treatment process.

The present invention can be applied to a magnetoresistive element in which the multilayer film further includes an antiferromagnetic layer. In this case, the antiferromagnetic layer may be formed together with the first ferromagnetic layer, the second ferromagnetic layer, and the non-magnetic layer in the film formation process.

When the antiferromagnetic layer is formed, a heat treatment process at a temperature of not less than 250° C. and less than 330° C. further may be performed in a magnetic field after the film formation process and before the preheat process. This heat treatment in a magnetic field may be required for the antiferromagnetic layer to pin one of the magnetization directions of the magnetic layers. An antiferromagnetic material included in the antiferromagnetic layer may include, e.g., Mn.

The preheat process may be performed in either a magnetic field or the absence of a magnetic field.

In the manufacturing method of the present invention, it is preferable that the heat treatment process is performed so that the temperature is not reduced to less than 330° C. after the preheat process. This makes it possible to produce an element efficiently in a short time.

The temperature profile of the preheat process is not particularly limited, as long as the temperature is 330° C. to 380° C. for a period of time in the above range. The preheat process may be performed during either one period or a plurality of periods.

As an example, the temperature profile (the period of time) may include a period of time to maintain a predetermined temperature between 330° C. and 380° C. for 10 to 300 minutes, and preferably for 15 to 30 minutes. By using this temperature profile, an element can be produced stably with improved yields. The temperature profile also may include a plurality of periods of time to maintain a predetermined temperature.

As another example of the temperature profile, the temperature may be raised gradually from 330° C. to 380° C. The temperature profile may include a period of time to raise the temperature at 0.17 to 1° C./min., and preferably at 0.25 to 1° C./min.

In the heat treatment process performed after the preheat treatment, the temperature is maintained at 400° C. to 450° C., e.g., for not less than 10 minutes, and preferably for 10 to 30 minutes.

The method of the present invention can be applied to a GMR element. However, it is suitable particularly for the manufacture of a TMR element that uses an insulating layer as a non-magnetic layer.

In the method of the present invention, it is preferable that at least one of the preheat process and the heat treatment process is performed in an atmosphere containing at least one selected from the group consisting of $H_2$, $O_2$, $O_3$, NO, $N_2O$, Ar and Xe or under a reduced pressure (e.g., $10^{-3}$ to $10^{-5}$ Pa). The heat treatment under a reduced pressure can provide an element with excellent characteristics. The high-temperature heat treatment at not less than 400° C. preferably is performed in a $H_2$ atmosphere.

Although the reason that the preheat process can suppress the characteristic degradation is not clarified fully at present, this process may cause the following changes in, e.g., a TMR element.

When the TMR element uses, e.g., an oxide layer as an insulating layer, the spin polarization of a magnetic layer may be reduced partially at the interface between the insulating layer and the magnetic layer due to oxidation. A heat treatment process at about 350° C. is considered to bring about the exchange of oxygen in the interface between the insulating layer and the magnetic layer, and the oxygen may be transferred from the magnetic layer to the insulating layer. This movement of oxygen can increase the spin polarization of the magnetic layer in the vicinity of the interface and make the insulating layer denser to enhance the barrier characteristic. Improvements in the spin polarization of the magnetic layer and the barrier characteristics of the insulating layer contribute to a better MR ratio.

A heat treatment process at not less than 400° C. is considered to bring about the diffusion of other atoms (e.g., Mn derived from an antiferromagnetic layer) as well as the exchange of oxygen in the interface between the insulating layer and the magnetic layer. The diffusion of Mn or the like makes the insulating layer less dense so that the barrier characteristic is lowered. In some cases, the diffusion may cause leakage of the insulating layer. Moreover, it prevents an improvement in spin polarization of the magnetic layer because oxygen or the like remains in the magnetic layer.

However, when a magnetoresistive element is heat-treated at 330° C. to 380° C. for a predetermined time before performing heat treatment at not less than 400° C., the improvement achieved by the exchange of oxygen exceeds the degradation caused by the diffusion of Mn or the like. Consequently, the non-magnetic layer can be densified prior to the high-temperature heat treatment. The dense non-magnetic layer allows fewer atoms (e.g., Mn) to diffuse, thus suppressing the degradation of the magnetoresistive element.

FIG. 1 shows the cross section of a spin valve magnetoresistive element. This element includes a substrate 5 and an antiferromagnetic layer 4, a ferromagnetic layer (pinned layer) 3, a non-magnetic layer 2, and a ferromagnetic layer 1 that are stacked in the indicated order on the substrate 5.

EXAMPLES

Example 1

A TMR element was produced in the following manner. Using multi-target magnetron sputtering, a Cu underlying layer having a thickness of 50 nm, a PtMn antiferromagnetic layer having a thickness of 20 nm, a CoFe ferromagnetic layer (Pinned layer) having a thickness of 2 nm, an $Al_2O_3$ tunnel layer having a thickness of 1 nm, and a CoFe ferromagnetic layer (free layer) having a thickness of 2 nm are stacked in the indicated order on an Si substrate (3 inch φ) provided with a thermal oxide film. The element area ranged from 30 μm×30 μm to 2 μm×2 μm. This element was heat-treated at 280° C. for 3 hours in a magnetic field of 5 kOe (1 Oe=79.6 A/m), and unidirectional anisotropy is imparted to the antiferromagnetic layer so as to pin the magnetization direction of the ferromagnetic layer in contact with the antiferromagnetic layer.

The MR ratio of the element thus produced was measured after heat treatment under various conditions.

The MR ratio was evaluated with a direct-current four-terminal method by applying a maximum magnetic field of 1 kOe to the TMR element. The MR ratio was determined by $$MR\ \text{ratio}=\{(R_{max}-R_{min})/R_{min}\}\times 100(\%)$$

where $R_{max}$ is a maximum resistance and $R_{min}$ is a minimum resistance.

Figure 2:
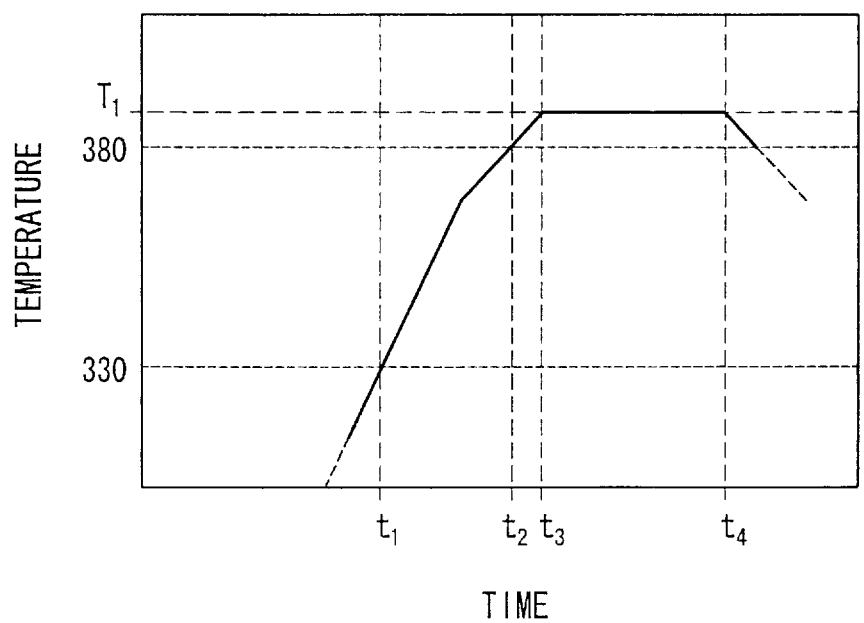
FIG. 2 shows an example of a temperature profile used to perform a method of the present invention.

For the heat treatment conditions, any one of temperature profiles shown in FIGS. 2 to 6 was used, and temperature and time for each sample were set as shown in Table 1. High-temperature heat treatment was performed at 400° C. for 30 minutes (represented by a temperature of $T_1$ and a predetermined time of $(t_4-t_3)$ in each of the temperature profiles). In the figures, when the gradient of the line joining two points in the profile is constant, the temperature is raised at a constant rate. For example, as shown in FIG. 2, the temperature is raised by 50° C. for 17.4 minutes (the average rate of temperature rise is 2.87° C./min.), and the rate of temperature rise is different in the first half of the process (4.14° C./min.) and in the second half of the process (1° C./min.).

Both the preheat process at 330° C. to 380° C. and the heat treatment process at 400° C. were performed in the absence of a magnetic field while reducing a pressure to $10^{-5}$ Pa.

TABLE 1

Figure 3:
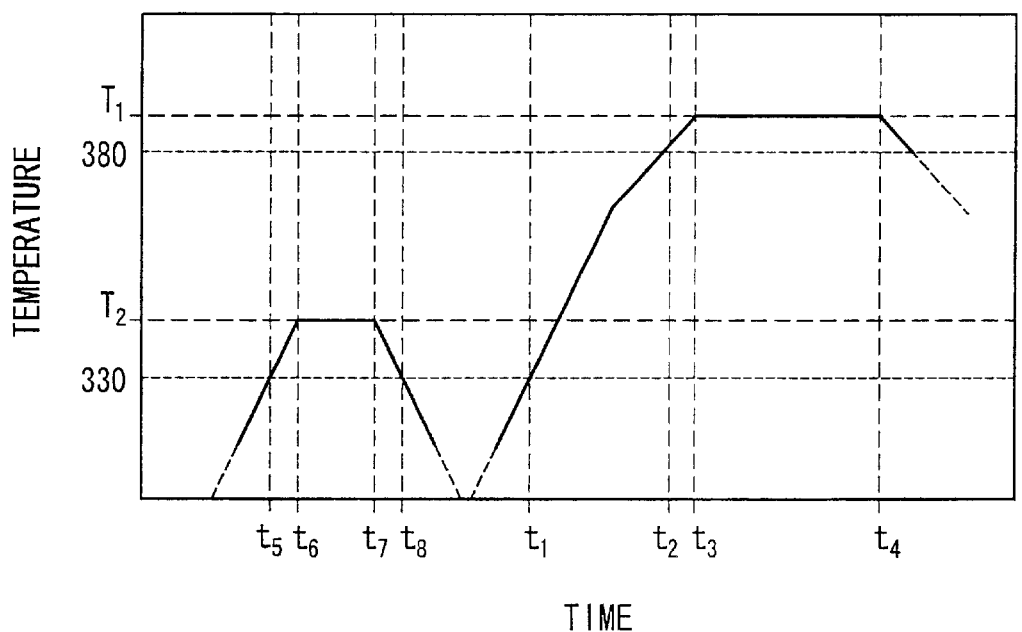
FIG. 3 shows another example of a temperature profile used to perform a method of the present invention.
Figure 4:
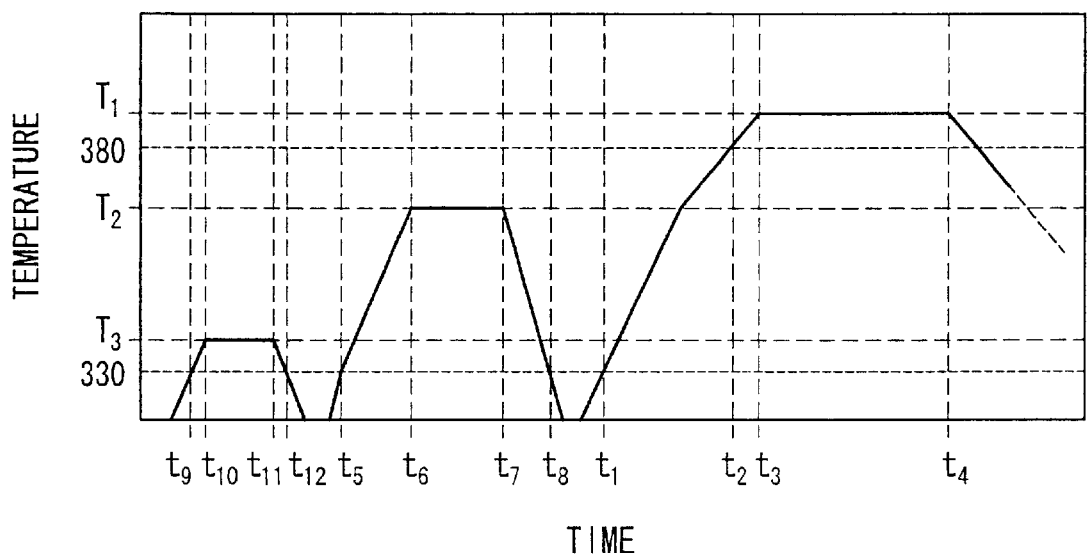
FIG. 4 shows yet another example of a temperature profile used to perform a method of the present invention.
Figure 5:
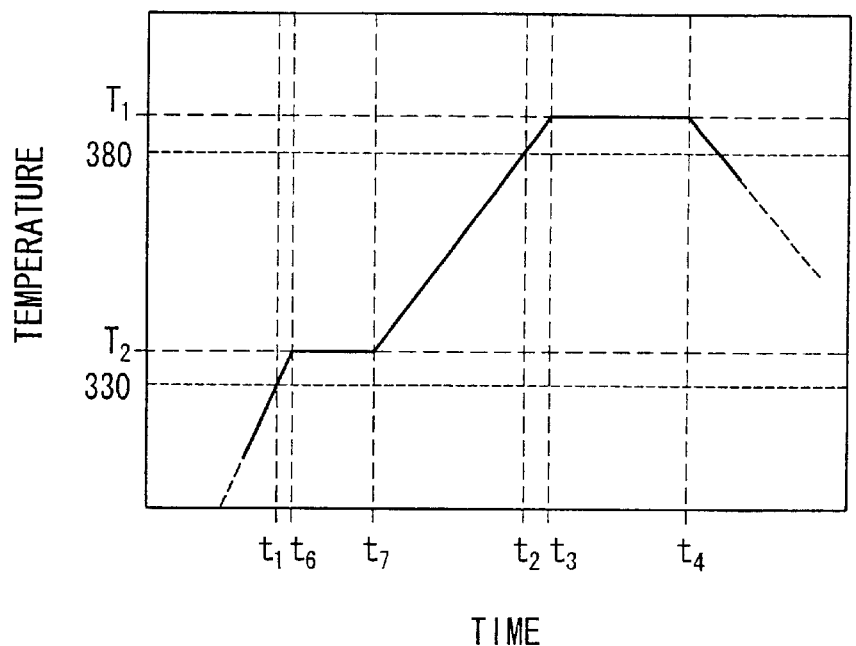
FIG. 5 shows still another example of a temperature profile used to perform a method of the present invention.

| | | Preheat process | | | | |
| | | Time to maintain predetermined temperature | | | | |
| Sample | Temperature profile | $t_7$-$t_6$/$T_2$ (min./° C.) | $t_{11}$-$t_{10}$/$T_3$ (min./° C.) | $t_{12}$-$t_9$ (min.) | Total time (min.) | MR ratio (%) |
|---|---|---|---|---|---|---|
| 1 | FIG. 2 | — | — | — | 17.4 | 11.2 |
| 2 | FIG. 3 | 5/340° C. | — | 18.4 | 35.8 | 10.4 |
| 3 | FIG. 3 | 5/370° C. | — | 42.0 | 59.4 | 12.0 |
| 4 | FIG. 3 | 30/340° C. | — | 43.4 | 60.8 | 38.4 |
| 5 | FIG. 3 | 15/370° C. | — | 52.0 | 69.4 | 36.4 |
| 6 | FIG. 4 | 15/370° C. | 15/340° C. | 52.0/28.4 | 97.8 | 37.9 |
| 7 | FIG. 5 | 5/340° C. | — | — | 58.0 | 11.7 |

TABLE 1-continued

Figure 6:
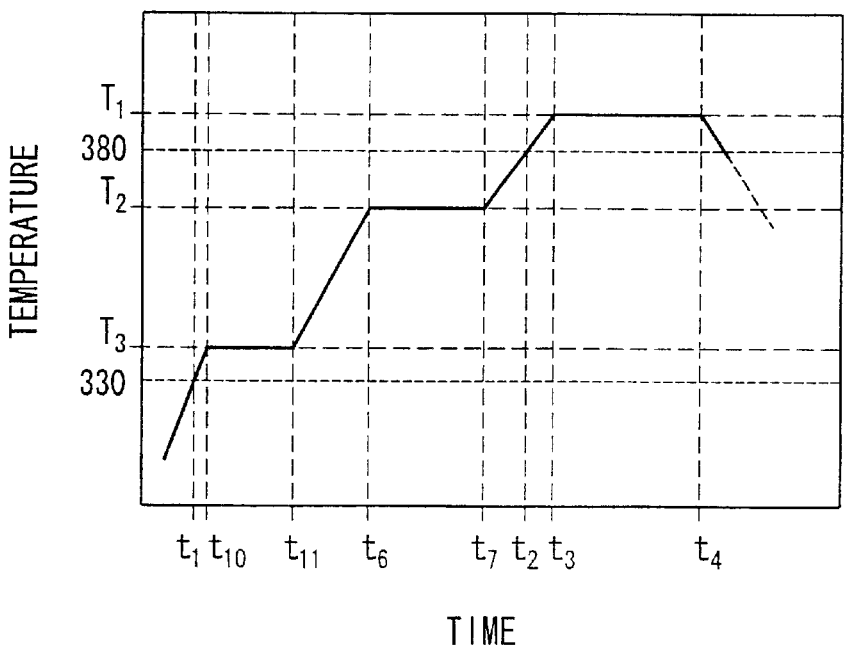
FIG. 6 shows still another example of a temperature profile used to perform a method of the present invention.

| Sample | Temperature profile | Preheat process | | | Total time (min.) | MR ratio (%) |
|---|---|---|---|---|---|---|
| | | Time to maintain predetermined temperature | | $t_8$-$t_5$/ | | |
| | | $t_7$-$t_6$/$T_2$ (min./° C.) | $t_{11}$-$t_{10}$/$T_3$ (min./° C.) | $t_{12}$-$t_9$ (min.) | | |
| 8 | FIG. 5 | 5/370° C. | — | — | 50.4 | 9.4 |
| 9 | FIG. 5 | 15/340° C. | — | — | 68.0 | 36.8 |
| 10 | FIG. 5 | 15/370° C. | — | — | 60.4 | 36.1 |
| 11 | FIG. 6 | 15/370° C. | 15/340° C. | — | 86.0 | 38.9 |
| 12 | FIG. 3 | 15/370° C. | — | 39.0 | 56.4 | 15.8 |

The MR ratio of the above element measured after the heat treatment in a magnetic field without any additional heat treatment was about 38%.

As shown in Table 1, the MR ratio of the samples that are preheated at 330° C. to 380° C. for not less than 60 minutes is not reduced significantly even after the high-temperature heat treatment at 400° C.

The present invention is not limited to the above example and can be applied to various magnetoresistive elements. For example, antiferromagnetic materials such as IrMn, FeMn, and PtPdMn may be used for the antiferromagnetic layer instead of PtMn. Conventionally known various magnetic layers may be used as the pinned layer and the free layer. For example, a laminated ferrimagnetic material can be used for the pinned layer, and a Fe—Ni—Co ferromagnetic material can be used for the free layer. A non-oxide material such as AlN can be used for the non-magnetic layer. A polycrystalline substrate such as AlTiC can be used instead of the thermal oxide substrate.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a magnetoresistive element, the magnetoresistive element comprising:
a substrate; and
a multilayer film formed on the substrate,
the multilayer film comprising a first ferromagnetic layer, a second ferromagnetic layer, and a non-magnetic layer arranged between the first ferromagnetic layer and the second ferromagnetic layer,
wherein a resistance value changes with a change in relative angle formed by magnetization directions of the first ferromagnetic layer and the second ferromagnetic layer,
the method comprising:
a film formation process for forming at least the first ferromagnetic layer, the second ferromagnetic layer, and the non-magnetic layer on the substrate;
a preheat process at 330° C. to 380° C. for not less than 60 minutes performed after the film formation process; and
a heat treatment process at 400° C. to 450° C. performed after the preheat process.

2. The method according to claim 1, wherein the multilayer film further comprises an antiferromagnetic layer, and the antiferromagnetic layer is formed together with the first ferromagnetic layer, the second ferromagnetic layer, and the non-magnetic layer in the film formation process.

3. The method according to claim 2, wherein a heat treatment process at a temperature of not less than 250° C. and less than 300° C. further is performed in a magnetic field after the film formation process and before the preheat process.

4. The method according to claim 1, wherein the preheat process is performed in the absence of a magnetic field.

5. The method according to claim 1, wherein the heat treatment process is performed so that the temperature is not reduced to less than 330° C. after the preheat process.

6. The method according to claim 1, wherein the preheat process comprises a period of time to maintain a predetermined temperature between 330° C. and 380° C. for 60 to 300 minutes.

7. The method according to claim 1, wherein the preheat process comprises a period of time to raise the temperature at 0.17 to 1° C./min.

8. The method according to claim 1, wherein the heat treatment process is performed at 400° C. to 450° C. for not less than 10 minutes.

9. The method according to claim 1, wherein the non-magnetic layer is an insulating layer.

10. The method according to claim 1, wherein at least one of the preheat process and the heat treatment process is performed in an atmosphere containing at least one selected from the group consisting of $H_2$, $O_2$, $O_3$, NO, $N_2O$, Ar and Xe or under a reduced pressure.

* * * * *